(12) United States Patent
Haque et al.

(10) Patent No.: US 10,740,888 B2
(45) Date of Patent: Aug. 11, 2020

(54) COMPUTER ASSISTED WEAK PATTERN DETECTION AND QUANTIFICATION SYSTEM

(71) Applicant: KLA-Tencor Corporation, Milpitas, CA (US)

(72) Inventors: Naoshin Haque, San Jose, CA (US); Allen Park, San Jose, CA (US); Ajay Gupta, Cupertino, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 421 days.

(21) Appl. No.: 15/275,726

(22) Filed: Sep. 26, 2016

(65) Prior Publication Data
US 2017/0309009 A1  Oct. 26, 2017

Related U.S. Application Data

(60) Provisional application No. 62/326,653, filed on Apr. 22, 2016.

(51) Int. Cl.
*G06T 7/00* (2017.01)
*H01L 21/66* (2006.01)

(52) U.S. Cl.
CPC ............ *G06T 7/0004* (2013.01); *H01L 22/12* (2013.01); *H01L 22/20* (2013.01); *G06T 2207/10061* (2013.01); *G06T 2207/30148* (2013.01)

(58) Field of Classification Search
CPC . G06T 7/0002–001; G06T 2207/30148; G06T 7/0004; G06T 2207/10061; H01L 22/12; H01L 22/20

USPC ........................................................ 382/149
See application file for complete search history.

(56) References Cited

U.S. PATENT DOCUMENTS

| | | | |
|---|---|---|---|
| 7,853,920 B2 | 12/2010 | Preil et al. | |
| 8,607,169 B2 | 12/2013 | Leu | |
| 2007/0105245 A1 | 5/2007 | Funakoshi et al. | |
| 2008/0058977 A1 | 3/2008 | Honda | |

(Continued)

OTHER PUBLICATIONS

Deborah A. Ryan et al., Application E-beam hot spot inspection for early detection of systematic patterning problems to a FinFET technology, J. Micro/Nanolith. MEMS MOEMS, vol. 14, Issue 2 021106, May 13, 2015, 14 pages.

(Continued)

*Primary Examiner* — Wesley J Tucker
(74) *Attorney, Agent, or Firm* — Suiter Swantz pc llo

(57) ABSTRACT

Methods and systems for providing weak pattern (or hotspot) detection and quantification are disclosed. A weak pattern detection and quantification system may include a wafer inspection tool configured to inspect a wafer and detect defects present on the wafer. The system may also include at least one processor in communication with the wafer inspection tool. The at least one processor may be configured to: perform pattern grouping on the detected defects based on design of the wafer; identify regions of interest based on the pattern grouping; identify weak patterns contained in the identified regions of interest, the weak patterns being patterns deviating from the design by an amount greater than a threshold; validate the identified weak patterns; and report the validated weak patterns or facilitate revision of the design of the wafer based on the validated weak patterns.

13 Claims, 4 Drawing Sheets

(56) References Cited

U.S. PATENT DOCUMENTS

| | | | |
|---|---|---|---|
| 2008/0290274 A1* | 11/2008 | Honda | G06T 7/0006 |
| | | | 250/311 |
| 2011/0170091 A1 | 7/2011 | Chang et al. | |
| 2011/0276935 A1 | 11/2011 | Fouquet et al. | |
| 2014/0270468 A1 | 9/2014 | Tam et al. | |
| 2014/0343884 A1 | 11/2014 | Leu | |
| 2015/0012900 A1 | 1/2015 | Shifrin et al. | |
| 2015/0022654 A1 | 1/2015 | Greenberg et al. | |
| 2015/0169820 A1 | 6/2015 | Wang | |
| 2015/0346610 A1 | 12/2015 | Tam et al. | |
| 2016/0116420 A1 | 4/2016 | Duffy et al. | |

OTHER PUBLICATIONS

Microtronic Macro Defect Management, Automated Macro Defect Inspection Equipment for Semiconductor Wafers, Printed online at http://wwwmicrotronic.com/products/automated-macro-wafer-defect-inspection-system/, Print date Feb. 18, 2016, 2 pages.

Ning Ma et al., Automatic hotspot classification using pattern-based clustering, Design for Manufacturability through Design-Process Integration II, Proc. of SPIE, vol. 6925, 692505, Mar. 4, 2008, pp. 1-10.

Yen-Ting Yu et al., DRC-Based Hotspot Detection Considering Edge Tolerance and Incomplete Specification, 2014 IEEE/ACM International Conference on Computer-Aided Design (ICCAD), Nov. 2014, San Jose, CA, pp. 101-107.

Duo Ding et al., High Performance Lithographic Hotspot Detection using Hierarchically Refined Machine Learning, 2011 16th Asia and South Pacific Design Automation Conference (ASP-DAC), Jan. 2011, pp. 775-780.

Andre Poock et al., OPC hotspot identification challenges: ORC vs. PWQ on wafer, Photomask Technology 2008, Proc. of SPIE vol. 7122, Oct. 17, 2008, 14 pages.

Crockett Huang et al., Using Design Based Binning to Improve Defect Excursion control for 45nm Production, Defect Management, Feb. 2008, Issue 1, Yield Management Solutions, www.kla-tencor.com/ymsmagazine, 4 pages.

International Search Report dated Jul. 31, 2017 for PCT/US2017/028983.

* cited by examiner

COMPUTER ASSISTED WEAK PATTERN DETECTION AND QUANTIFICATION SYSTEM

CROSS-REFERENCE TO RELATED APPLICATIONS

The present application claims the benefit under 35 U.S.C. § 119(e) of U.S. Provisional Application Ser. No. 62/326,653, filed Apr. 22, 2016. Said U.S. Provisional Application Ser. No. 62/326,653 is hereby incorporated by reference in its entirety.

TECHNICAL FIELD

The disclosure generally relates to the field of inspection, and particularly to wafer inspection.

BACKGROUND

Thin polished plates such as silicon wafers and the like are a very important part of modern technology. A wafer, for instance, may refer to a thin slice of semiconductor material used in the fabrication of integrated circuits and other devices. Other examples of thin polished plates may include magnetic disc substrates, gauge blocks and the like. While the technique described here refers mainly to wafers, it is to be understood that the technique also is applicable to other types of polished plates as well. The term wafer and the term thin polished plate may be used interchangeably in the present disclosure.

Wafers are subject to defect inspections. Defects can be random or systematic. Systematic defects may occur on certain design patterns and may be referred to as hotspots (i.e., weak patterns, or patterns produced on a wafer that deviated from the design). One of the objectives of defect inspection is to detect and quantify these hotspots. For instance, an inspection process may utilize an inspection tool to scan a wafer and bin the detected defects using design-based grouping (DBG). The defects may be sampled and reviewed using a scanning electron microscope (SEM) and manually classified to determine the presence of hotspots. Simulations may be utilized to help predict patterns or sites that are susceptible to failures, which may in turn be used to help users place inspection care in areas that may contain such patterns or sites.

It is noted that while the inspection process described above can be helpful, this inspection process is also associated with some disadvantages. For example, this inspection process relies on human eyes to determine the presence of defects, which means this inspection process is only capable of processing small sample sizes and lacks validation. In practice, systematic defects that are detected with critical dimension (CD) changes of about 20-30% may be discarded. In addition, since there is no automation and all classification must be done by a human, the sample size is typically limited to no more than about 5 thousand defects and is prone to error due to sampling and fatigue. With the explosion of data volume resulting from increased detection sensitivity, effectiveness of sampling can be limited unless an automated approach is developed. Furthermore, simulations help predict risky sites but they do not help user to identify if the sites actually fail post processing.

Therein lies a need for providing methods and systems for weak pattern detection and quantification without the aforementioned shortcomings.

SUMMARY

The present disclosure is directed to a system. The system may include a wafer inspection tool configured to inspect a wafer and detect defects present on the wafer. The system may also include at least one processor in communication with the wafer inspection tool. The at least one processor may be configured to: perform pattern grouping on the detected defects based on design of the wafer; identify regions of interest based on the pattern grouping; identify weak patterns contained in the identified regions of interest, the weak patterns being patterns deviating from the design by an amount greater than a threshold; validate the identified weak patterns; and report the validated weak patterns or facilitate revision of the design of the wafer based on the validated weak patterns.

A further embodiment of the present disclosure is directed to a system. The system may include a wafer inspection tool configured to inspect a wafer and detect defects present on the wafer. The system may also include at least one processor in communication with the wafer inspection tool. The at least one processor may be configured to: perform pattern grouping on the detected defects based on design of the wafer; simulate effects of a wafer process tool on the wafer; identify regions of interest where patterns deviated from the design of the wafer; identify weak patterns contained in the identified regions of interest, the weak patterns being patterns deviating from the design by an amount greater than a threshold; validate the identified weak patterns; and report the validated weak patterns or facilitate revision of the design of the wafer based on the validated weak patterns.

An additional embodiment of the present disclosure is directed to a system. The system may include a wafer inspection tool configured to inspect a wafer and detect defects present on the wafer. The system may also include at least one processor in communication with the wafer inspection tool. The at least one processor may be configured to: perform pattern grouping on the detected defects based on design of the wafer; obtain scanning electron microscope (SEM) images of the wafer; align the SEM images of the wafer against the design of the wafer; identify regions of interest based on alignment of the SEM images of the wafer and the design of the wafer; obtain metrology of the wafer in the identified regions of interest; measure pattern variations in the identified regions of interest based on the metrology obtained; identify weak patterns based on the pattern variations, the weak patterns being patterns deviating from the design by an amount greater than a threshold; validate the identified weak patterns; and report the validated weak patterns or facilitate revision of the design of the wafer based on the validated weak patterns.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Embodiments in accordance with the present disclosure are directed to methods and systems for providing weak pattern (or hotspot) detection and quantification. More specifically, computer-driven design-to-hotspot detection and validation systems that enable use of computer assists to automatically discover and quantify hotspots on wafers are disclosed. In some embodiments, systems configured in accordance with the present disclosure may be configured to enable an automatic identification of weak points within a hotspot. In some embodiments, systems configured in accordance with the present disclosure may be further configured to take an algorithmic approach to separate and bin hotspots based on severity (or marginality) of pattern variations. It is contemplated that methods and systems configured in accordance with the present disclosure may provide significant improvements in both efficiency and accuracy over existing hotspot inspection methods and systems.

Figure 1:
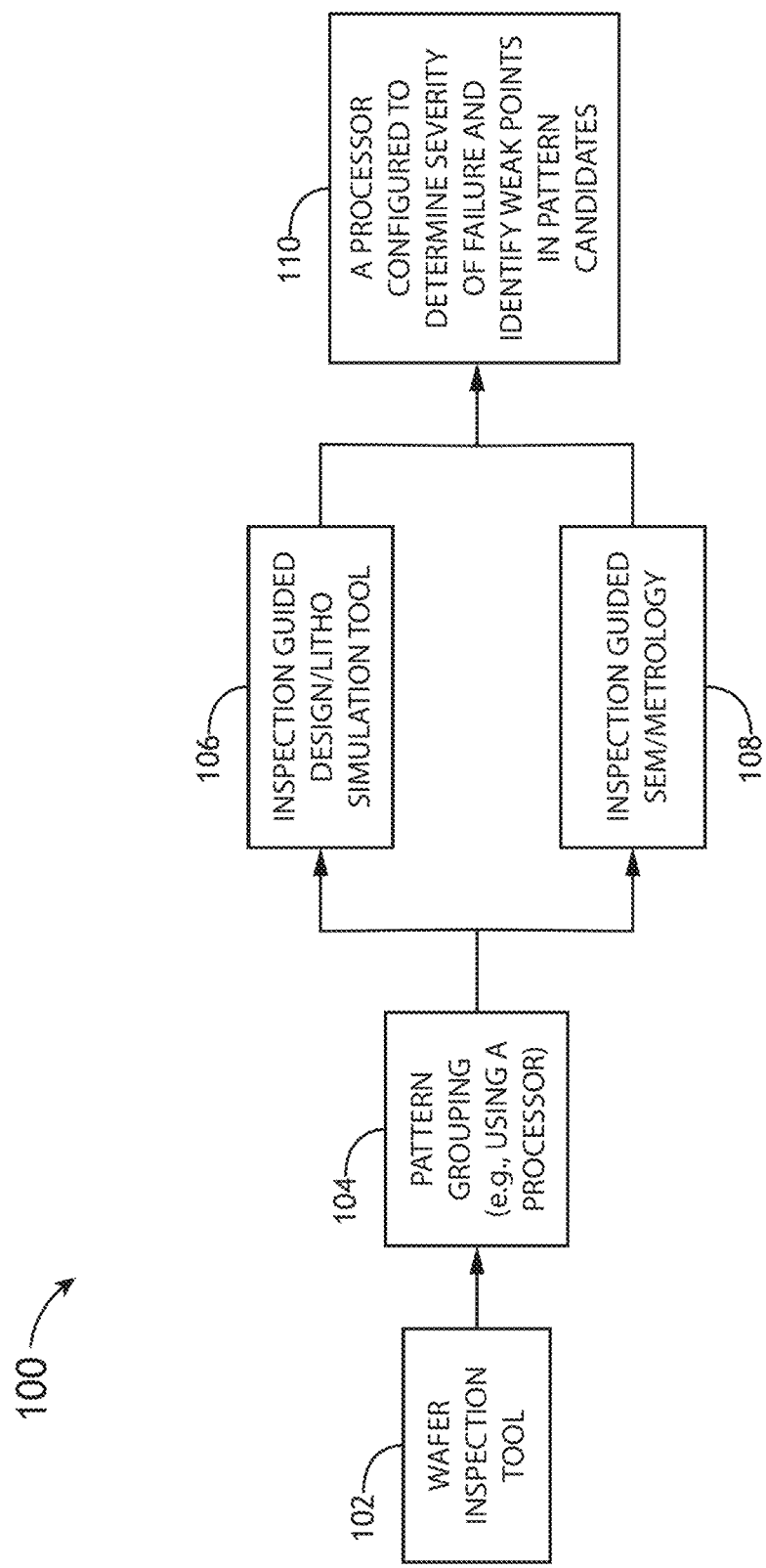
FIG. 1 is an illustration depicting an inspection system configured in accordance with an embodiment of the present disclosure.

Referring now to FIG. 1, an illustration depicting an exemplary inspection system 100 configured in accordance with an embodiment of the present disclosure is shown. The inspection system 100 may include an inspection tool 102 (e.g., a broadband plasma inspection tool, a metrology inspection tool, an electron beam inspection tool, with or without output from simulations provided by design rule check (DRC), optical rule check (ORC) or the like). The inspection tool 102 may be configured to inspect a wafer (e.g., a patterned wafer) and detect defects present on that wafer. The detected defects may be provided to one or more processors 104 (e.g., dedicated processing units, application-specific integrated circuits (ASICs), field-programmable gate arrays (FPGAs) or various other types of processors or processing units), which may be configured to perform a single-step or a multi-step pattern grouping based on design. In some embodiments, the pattern grouping may be performed utilizing a technique commonly referred to as design-based binning (may also be referred to as design based grouping or classification). Design-based binning may integrate design information and defect inspection results to group the detected defects into different groups/bins based on their pattern types.

Potential hotspots may be identified upon completion of pattern grouping. In some embodiments, a simulation-based identification process 106 may be utilized to simulate a design or a wafer process (e.g., a lithography) to search for regions of interest that may contain potential hotspots. Regions of interest may be placed automatically for each pattern type (e.g. in accordance with pattern grouping/binning) with high accuracy to automatically evaluate local CD and other pattern variations such as line-end shortening and corner rounding. Alternatively and/or additionally, a layout-based identification process 108 may be utilized to automatically identify regions of interest for the defective sites identified by the inspection tool 102. Regardless of which identification process (simulation based 106 or layout based 108) is utilized, it is noted that a filtering step 110 may be engaged to help determine the severity of the failures occurring in the identified regions of interest and filter out some of the identified regions based the severity of the failures. The remaining regions may be reported as regions containing potential hotspots, which may then be validated using processes that will be described in details below.

Figure 2:
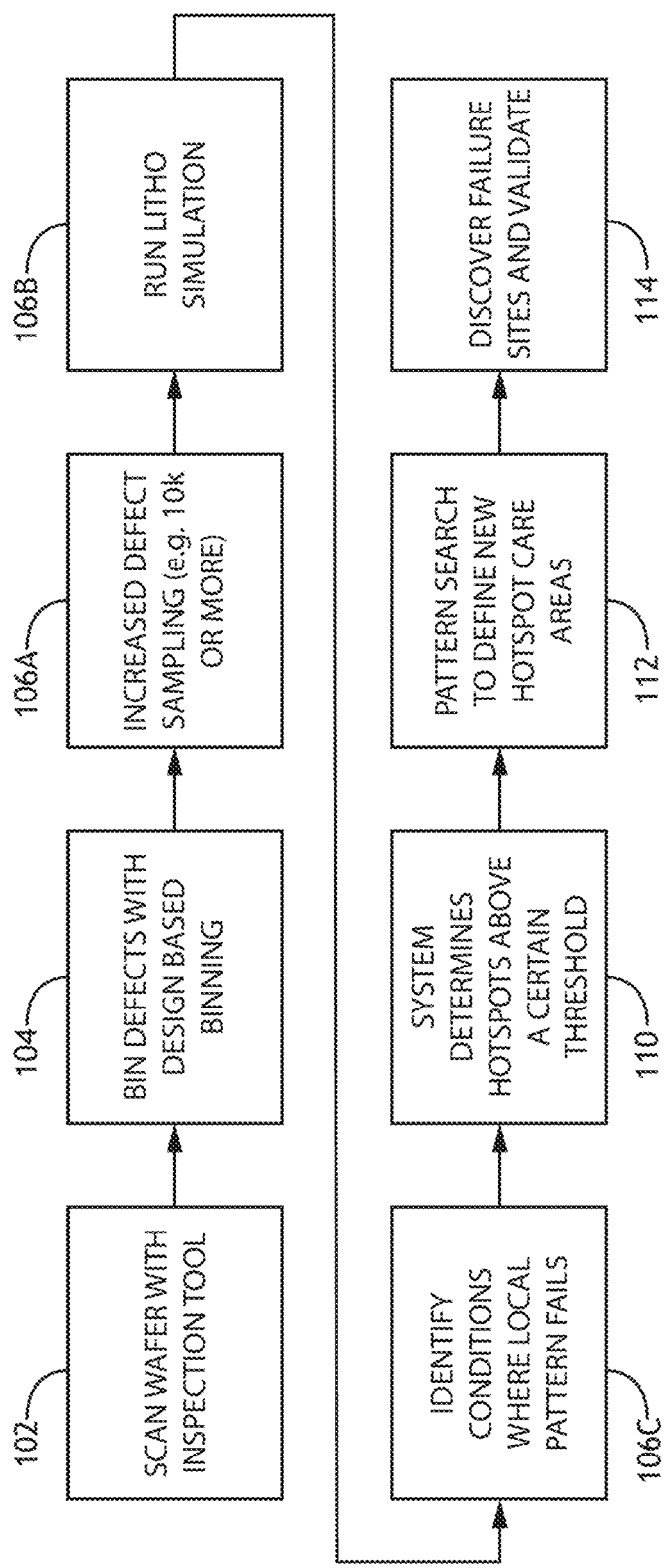
FIG. 2 is an illustration depicting a simulation-based hotspot detection and quantification process configured in accordance with an embodiment of the present disclosure.

Referring now to FIG. 2, a more detailed illustration depicting an exemplary implementation of a simulation-based hotspot detection and quantification process is shown. It is noted that because the simulation-based hotspot detection and quantification process is an automated process (i.e., the identification process does not rely on human eyes to determine the presence of defects), the defect sample size is no longer restricted by human abilities. In other words, it is contemplated that the defect sample size may be increased (step 106A) as needed to help increase the accuracy of the hotspot detection and quantification process.

With the samples selected, one or more simulators (e.g., implemented using one or more processors) may be engaged to carry out one or more simulation programs running thereon to simulate effects of wafer process tools such as lithography, chemical-mechanical planarization, etch or the like in a simulation step 106B. It is contemplated that the simulation is able to show how certain regions change across different focus and offset conditions without having to scan the wafer. The result of the simulation may be processed in an identification step 106C to search for local changes and to identify regions where local patterns may fail (e.g., deviated from the design). A filtering step 110 may then be utilized to filter out some of the identified regions based on one or more threshold values established for one or more measurement metrics (e.g., regions with CD changes below a certain threshold may be filtered out). The filtering step 110 may automatically identify pattern failures based on the threshold value(s) and/or based on outlier(s) that exhibit more than a typical amount of variations. It is noted that the threshold value(s) used in this manner can help determine the severity of the failures and quantify weak points based on required specifications. The remaining regions (i.e., regions where local patterns may have deviated from the design by an amount greater than the threshold) may then be reported as regions containing potential hotspots, which may need to be validated by a validation process.

The validation process may be carried out in various ways. In some embodiments, for instance, a pattern search step 112 may be invoked to help define hotspot care areas (may also be referred to as inspection care areas) around the reported potential hotspots. An inspection tool capable of sampling and providing scanning electron microscope (SEM) review of the defined inspection care areas may then be utilized to help confirm the validity of the hotspots in a validation step 114. In some embodiments, if the inspection tool 102 is capable of sampling and providing SEM reviews, the same inspection tool 102 may be utilized to carry out the validation step 114. Otherwise, a second inspection tool may be utilized to carry out the validation step 114. The validated hotspots (i.e., patterns that are confirmed to be weak patterns) may then be reported to a user (e.g., a wafer engineer or a designer) or provided to facilitate revision of the design of the wafer (e.g., in an effort to reduce or eliminate weak patterns).

In some embodiments, pattern fidelity measurements may be taken (e.g., to measure the CD variations) to help confirm the validity of the hotspots in the validation step 114. Pattern fidelity measurements may indicate pattern variations and/or deviations from intended pattern morphology. In some embodiments, the pattern fidelity measurements may be taken utilizing techniques similar to that disclosed in U.S. patent application Ser. No. 14/918,394, entitled "Automated Pattern Fidelity Measurement Plan Generation," which is hereby incorporated by reference in its entirety. It is to be understood that other pattern fidelity measurement techniques may also be utilized without departing from the spirit and the scope of the present disclosure.

It is also to be understood that the validation process described above is merely exemplary and is not meant to be limiting. In some embodiments, for example, the pattern fidelity measurements may be taken prior to the pattern search to automatically confirm the hotspots. The pattern search may then be executed (to help define inspection care areas), but the search may be limited to only the confirmed hotspots. The wafer with inspection care areas defined may then be inspected, sampled and SEM reviewed. If needed, pattern fidelity measurements may be taken again to measure the CD variations in these hotspots.

As will be appreciated from the above, the hotspot detection and quantification process can be automated in various ways to help increase the efficiency and accuracy of the process. It is also noted that because the hotspot detection and quantification process can be carried out in various ways, it is possible to allow different layers to use different hotspot detection and quantification processes. For example, one particular hotspot detection and quantification process may be well suited for identifying hotspots in an after-develop inspection (ADI) layer while a slightly different hotspot detection and quantification process (e.g., with processing steps performed in a slightly different order) may be better suited for identifying hotspots in a different (e.g., a post-etch) layer. It is therefore contemplated that hotspot detection and quantification processes configured in accordance with the present disclosure may be implemented differently for different purposes without departing from the spirit and the scope of the present disclosure.

Figure 3:
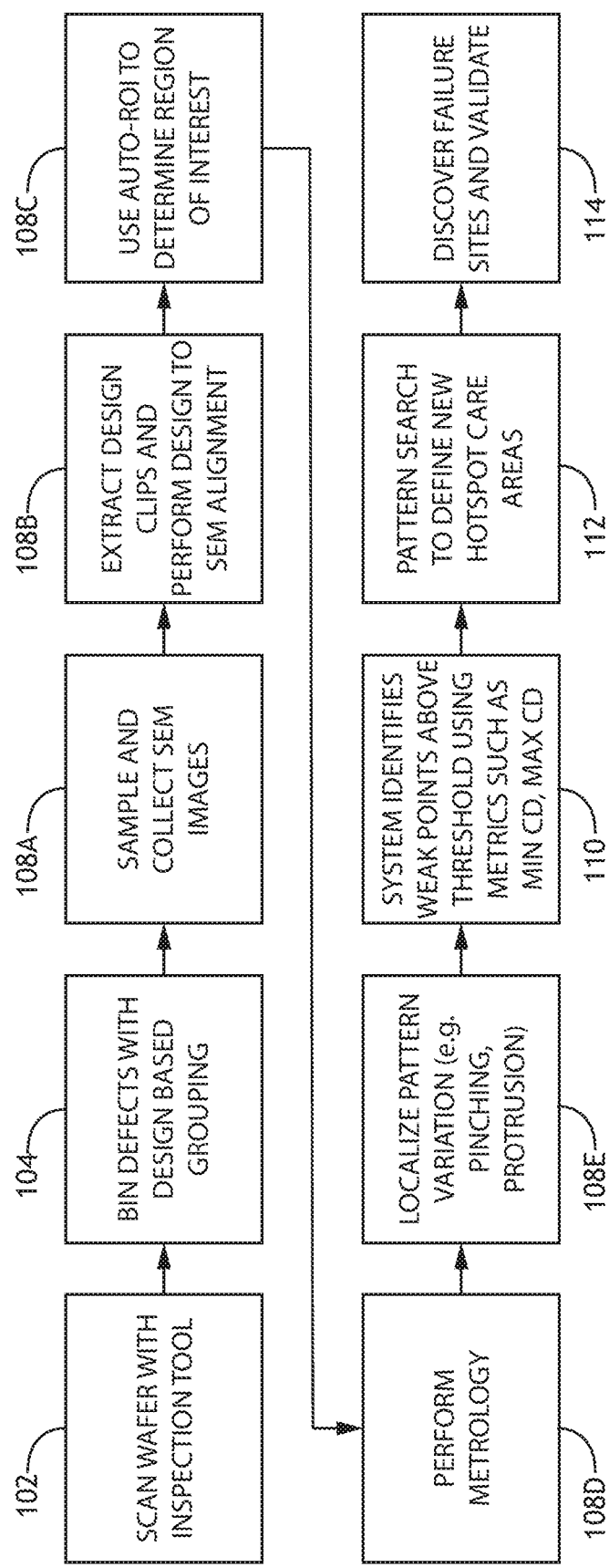
FIG. 3 is an illustration depicting a layout-based hotspot detection and quantification process configured in accordance with an embodiment of the present disclosure.
Figure 4:
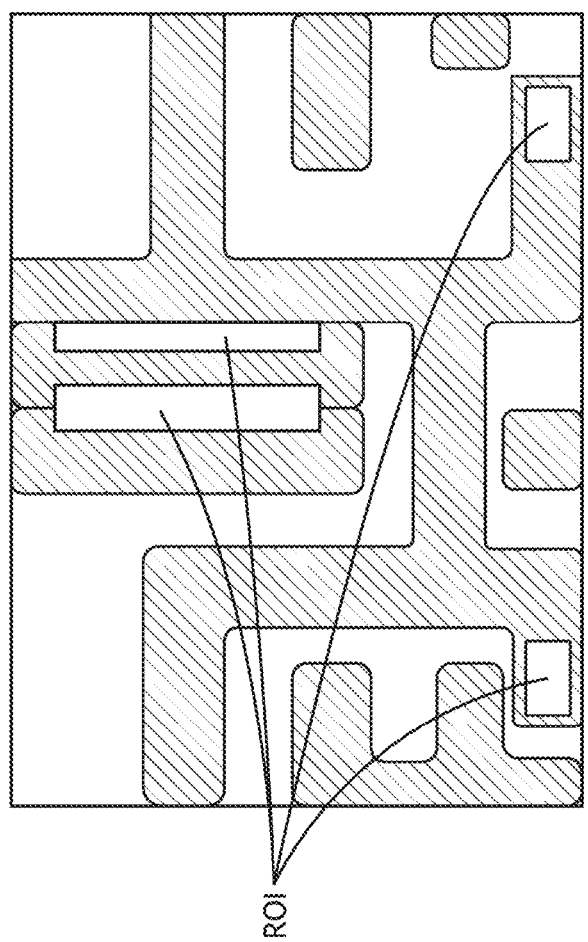
FIG. 4 is an illustration depicting a plurality of identified regions of interest on a wafer.

Referring now to FIG. 3, a more detailed illustration depicting an exemplary implementation of a layout-based hotspot detection and quantification process is shown. The layout-based hotspot detection and quantification process configured in this manner may use design layout to identify regions of interest automatically for the defective sites identified by the inspection tool 102. More specifically, as shown in FIG. 3, the wafer may be sampled and SEM images of the wafer may be collected in an SEM imaging step 108A. The SEM images may then be aligned against the design in an alignment step 108B and regions of interest may be identified automatically (e.g., at the end of the lines, corners, minimum CD areas or the like, as shown in FIG. 4) in a step 108C. Subsequently, metrology may be performed to look for potential bias only in the identified regions of interest in a step 108D and pattern variations (e.g., in terms of pinching, protrusion or the like) in the identified regions of interest may be measured in a step 108E.

A filtering step 110 may then be utilized to filter out some of the identified regions based on one or more threshold values established for one or more measurement metric. In some embodiments, pattern fidelity measurements may be taken on these regions (e.g., to measure the CD variations) and potential hotspots may be determined based on the severity of the CD variations (e.g., either as absolute or relative changes). These potential hotspots may then be validated by a validation process similar to that described above. For example, the potential hotspots may be validated by running pattern searches for the entire wafer, inspecting the wafer inspection care areas on the inspection tool, sampling and reviewing SEM defects, and again running pattern fidelity measurements to measure the CD variations.

It is noted that the hotspot detection and quantification processes configured in accordance with the present disclosure use process simulations and/or layout-based approaches to effectively determine hotspots automatically, not as prediction before inspection but as tools to identify and assess failure algorithmically. It is noted that hotspot detection and quantification processes (both simulation-based and layout-based) configured in accordance with the present disclosure are capable of discovering more hotspots compared to existing methods by increasing sampling through automated assessment of pre-SEM data. It is also noted that hotspot detection and quantification processes configured in accordance with the present disclosure can enable automatic placement of regions of interest for each pattern type (e.g., each bin as determined based on design based binning) with high accuracy to automatically evaluate local CD and other pattern variations such as line-end shortening and corner rounding.

It is further noted that hotspot detection and quantification processes configured in accordance with the present disclosure can also eliminate human subjectivity in determining pattern variations and severity of failures. In addition, hotspot detection and quantification processes configured in accordance with the present disclosure can enable complete automated flow for hotspot discovery including identification and quantification of failed sites, which in turn can provide time saving as automated metrology and simulation throughput increase. Furthermore, it is noted that hotspot detection and quantification processes configured in accordance with the present disclosure do not require simulation ahead of time for all pattern types. In other words, hotspot detection and quantification processes configured in accordance with the present disclosure has no dependency on predicting hotspots either on the design, wafer or reticle.

It is to be understood that the threshold value(s) referenced in the examples above may be user-defined or system-defined. A user may, for example, define an amount of deviation from an intended or nominal value as a threshold value. A system configured in accordance with the present disclosure may also define the threshold value(s). The system may, for example, define deviation amount where weak pattern is identified if certain location exceeds certain value from typical amount of variation. It is to be understood that the methods and systems described in the present disclosure may be implemented to support both user-defined and/or system-defined threshold values without departing from the spirit and scope of the present disclosure.

It is also to be understood that while the examples above referred to wafers, the systems and methods in accordance with the present disclosure are applicable to other types of polished plates as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks and the like.

It is contemplated that the methods and systems described in the present disclosure may be implemented as standalone products or as components of various wafer measurement, inspection, and/or hotspot discovery tools. It is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. It is also understood that the various blocks depicted in the figures are presented separately for illustrative purposes. It is contemplated that while the various blocks depicted in the figures may be implemented as separate (and communicatively coupled) devices and/or processing units, they may also be integrated together without departing from the spirit and the scope of the present disclosure.

It is believed that the system and the apparatus of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A system, comprising:
   a broadband plasma wafer inspection tool configured to inspect a wafer and detect defects present on the wafer; and
   at least one processor in communication with the wafer inspection tool, the at least one processor configured to:
      perform a multi-step pattern grouping on the detected defects based on design of the wafer;
      automatically identify regions of interest based on the pattern grouping;
      identify weak patterns contained in the identified regions of interest, the weak patterns being patterns deviating from the design by an amount greater than a threshold;
      direct a second wafer inspection tool to validate the identified weak patterns on the wafer, wherein the second wafer inspection tool comprises a scanning electron microscopy tool; and
      report the validated weak patterns or facilitate revision of the design of the wafer based on the validated weak patterns.

2. The system of claim 1, wherein the at least one processor is configured to identify the weak patterns by:
   simulating effects of a wafer process tool on the wafer;
   identifying regions of interest where patterns deviated from the design of the wafer; and
   identifying the weak patterns contained in the identified regions of interest.

3. The system of claim 2, wherein the at least one processor is configured to validate the identified weak patterns by:
   defining at least one inspection care area around the identified weak patterns based on a pattern search; and
   facilitating sampling and scanning electron microscope (SEM) reviewing of the at least one inspection care area to validate the weak patterns.

4. The system of claim 3, wherein the at least one processor is further configured to take pattern fidelity measurements to validate the weak patterns.

5. The system of claim 4, wherein the pattern fidelity measurements include measurements of local critical dimension variations.

6. The system of claim 2, wherein the at least one processor is configured to:
   validate the identified weak patterns based on pattern fidelity measurements;
   pattern search only the validated weak patterns to define at least one inspection care area around the validated weak patterns; and
   facilitate sampling and SEM reviewing of the at least one inspection care area.

7. The system of claim 1, wherein identified weak patterns with local critical dimension variations greater than the threshold are confirmed as valid weak patterns.

8. A system, comprising:
   a broadband plasma wafer inspection tool configured to inspect a wafer and detect defects present on the wafer; and
   at least one processor in communication with the wafer inspection tool, the at least one processor configured to:
      perform multi-step pattern grouping on the detected defects based on design of the wafer;
      perform a simulation to simulate effects of a wafer process tool on the wafer;
      analyze an output of the simulation to automatically identify regions of interest where patterns deviated from the design of the wafer;
      identify weak patterns contained in the identified regions of interest, the weak patterns being patterns deviating from the design by an amount greater than a threshold;
      direct a second wafer inspection tool to validate the identified weak patterns on the wafer, the second wafer inspection tool is different from the broadband plasma wafer inspection tool, wherein the second wafer inspection tool comprises a scanning electron microscopy tool; and
      report the validated weak patterns or facilitate revision of the design of the wafer based on the validated weak patterns.

9. The system of claim 8, wherein the at least one processor is configured to validate the identified weak patterns by:
   defining at least one inspection care area around the identified weak patterns based on a pattern search; and
   facilitating sampling and scanning electron microscope (SEM) reviewing of the at least one inspection care area to validate the weak patterns.

10. The system of claim 9, wherein the at least one processor is further configured to take pattern fidelity measurements to validate the weak patterns.

11. The system of claim 10, wherein the pattern fidelity measurements include measurements of local critical dimension variations.

12. The system of claim 8, wherein the at least one processor is configured to:
   validate the identified weak patterns based on pattern fidelity measurements;
   pattern search only the validated weak patterns to define at least one inspection care area around the validated weak patterns; and
   facilitate sampling and SEM reviewing of the at least one inspection care area.

13. The system of claim 8, wherein weak patterns identified with local critical dimension variations greater than the threshold are confirmed as valid weak patterns.

* * * * *